United States Patent
Upmaka et al.

(10) Patent No.: US 11,921,144 B2
(45) Date of Patent: Mar. 5, 2024

(54) METHOD AND APPARATUS TO USE EMBEDDED PATTERNS AND S-PARAMETERS OF A SMALL PHASED ARRAY TO BUILD LARGE PHASED ARRAYS

(71) Applicant: Keysight Technologies, Inc., Santa Rosa, CA (US)

(72) Inventors: Murthy S. Murali Upmaka, Franklin Township, NJ (US); Yan-Hua Cui, Beijing (CN)

(73) Assignee: KEYSIGHT TECHNOLOGIES, INC., Santa Rosa, CA (US)

( * ) Notice: Subject to any disclaimer, the term of this patent is extended or adjusted under 35 U.S.C. 154(b) by 194 days.

(21) Appl. No.: 17/093,820

(22) Filed: Nov. 10, 2020

(65) Prior Publication Data
US 2022/0146562 A1     May 12, 2022

(51) Int. Cl.
*G01R 29/10*     (2006.01)
*G01R 29/08*     (2006.01)
*H01Q 3/26*      (2006.01)

(52) U.S. Cl.
CPC ......... *G01R 29/10* (2013.01); *G01R 29/0864* (2013.01); *H01Q 3/267* (2013.01)

(58) Field of Classification Search
CPC ..... G01R 29/10; G01R 29/0864; H01Q 3/267
See application file for complete search history.

(56) References Cited

U.S. PATENT DOCUMENTS

2013/0214971 A1*  8/2013  Robinson .............. H01Q 3/267
                                                    342/360
2019/0104421 A1*  4/2019  Urzhumov .......... H01Q 15/0086

OTHER PUBLICATIONS

Constantine A. Balanis, Antenna Theory: Analysis Design, 2005, John Wiley & Sons Inc., 3rd Edition, p. 283-364 (Year: 2005).*
A. Bhattacharyya, "An Accurate Model for Finite Array Patterns Based on Floquet Modal Theory", IEEE Transactions on Antennas and Propagation, vol. 63, No. 3, Mar. 2015.
Won-Seok Lee, Seung-Tae Khang, Kyoung-Sub Oh, and Jong-Won Yu, "Design Methodology for Phased Subarray Antennas with Optimized Element Phase Control", Proceedings of the 10th European Radar Conference, Oct. 9-11, 2013, Nuremberg, Germany.
J. B.L. Rao, T. C. Cheston, J. Y. Choe, M.G. Parent and P.K. Hughes 11, "Phased Arrays With Sub-Array Architecture", Proceedings 2000 IEEE International Conference on Phased Array Systems and Technology (Cat. No. 00TH8510).
R. C. Hansen, "Subarray Quantization Lobe Decollimation", IEEE Transactions on Antennas and Propagation, vol. 47, No. 8, Aug. 1999.

(Continued)

*Primary Examiner* — Ricardo I Magallanes
*Assistant Examiner* — Yonchan J Kim

(57) ABSTRACT

To model a phased array antenna having a target array of antenna elements, a small array of antenna elements is selected that has fewer antenna elements than the target array. For each antenna element of the small array of antenna elements, far field patterns are captured for a plurality of signal frequencies. S-parameters for the small array of antenna elements are captured for the plurality of signal frequencies. The far field patterns captured for the antenna elements of the small array are mapped to antenna elements of the target array of antenna elements. The S-parameters captured for the small array are mapped to the target array.

20 Claims, 7 Drawing Sheets

(56) References Cited

OTHER PUBLICATIONS

Rick Gentile, Algorithms to Antenna: Understanding Subarray Tradeoffs in Large Antenna Arrays,Mar. 21, 2018, 2018, Internet post available at: https://www.mwrf.com/technologies/systems/article/21849050/algorithms-to-antenna-understanding-subarray-tradeoffs-in-large-antenna-arrays.
"Subarrays in Phased Array Antennas", Internet post available at: https://www.mathworks.com/help/phased/ug/subarrays-in-phased-array-antennas.html;jsessionid=e4157677710fecc3160ba9d9a1f5.

* cited by examiner

|   |   |   |   |   |   |   |   |
|---|---|---|---|---|---|---|---|
| 1 | 2 | 3 | 3 | 3 | 3 | 4 | 5 |
| 6 | 7 | 8 | 8 | 8 | 8 | 9 | 10 |
| 11 | 12 | 13 | 13 | 13 | 13 | 14 | 15 |
| 11 | 12 | 13 | 13 | 13 | 13 | 14 | 15 |
| 11 | 12 | 13 | 13 | 13 | 13 | 14 | 15 |
| 11 | 12 | 13 | 13 | 13 | 13 | 14 | 15 |
| 16 | 17 | 19 | 18 | 18 | 18 | 19 | 20 |
| 21 | 22 | 23 | 23 | 23 | 23 | 24 | 25 |

|  |  |  |  |  |  |  |  |
|---|---|---|---|---|---|---|---|
| 1 | 2 | 3 | 4 | 5 | 6 | 7 | 8 |
| 9 | 10 | 11 | 12 | 13 | 14 | 15 | 16 |
| 17 | 18 | 19 | 20 | 21 | 22 | 23 | 24 |
| (25) | 26 | 27 | 28 | 29 | 30 | 31 | 32 |
| 33 | 34 | 35 | 36 | 37 | 38 | 39 | 40 |
| 41 | 42 | 43 | 44 | 45 | 46 | 47 | 48 |
| 49 | 50 | 51 | 52 | 53 | 54 | 55 | 56 |
| 57 | 58 | 59 | 60 | 61 | 62 | 63 | 64 |

FIG. 8

|  |  |  |  |  |  |  |  |
|---|---|---|---|---|---|---|---|
| 1 | 2 | 3 | 4 | 5 | 6 | 7 | 8 |
| 9 | 10 | 11 | 12 | 13 | 14 | 15 | 16 |
| 17 | 18 | 19 | 20 | 21 | 22 | 23 | 24 |
| 25 | 26 | 27 | (28) | 29 | 30 | 31 | 32 |
| 33 | 34 | 35 | 36 | 37 | 38 | 39 | 40 |
| 41 | 42 | 43 | 44 | 45 | 46 | 47 | 48 |
| 49 | 50 | 51 | 52 | 53 | 54 | 55 | 56 |
| 57 | 58 | 59 | 60 | 61 | 62 | 63 | 64 |

FIG. 9

METHOD AND APPARATUS TO USE EMBEDDED PATTERNS AND S-PARAMETERS OF A SMALL PHASED ARRAY TO BUILD LARGE PHASED ARRAYS

BACKGROUND

Phased array antennas, typically composed of multiple antenna elements arranged in an array formation, are often used for directional sending and receiving of data. To send signals, phased array antennas achieve beam forming by adding together radiation patterns from each antenna elements to concentrate energy into a narrow beam of radiation. Typically, phase shifters and attenuators are used to generate radiation patterns from each phased array antenna that will interfere with each other constructively and destructively to achieve the desired radiation beam. Phase shifters and attenuators are likewise also used to receive radiation beams and reconstruct the originally sent signal.

When designing for manufacture a phased array antenna, modeling of a design is often used to model a design to detect how the phased array antenna will perform. Modeling often includes predicting far field patterns that will be created by the phased array antenna, as well as scattering parameters (S-parameters) for the phased array antenna. The complexity of this modeling can increase exponentially with the number of antenna elements. For a phased array antenna with more than a very few antenna elements accurate modeling is not possible without very sophisticated software tools that require significant processing resources. One such software tool is Pathwave EM Design (EMPro) software available from Keysight Technologies, 1400 Fountaingrove Parkway, Santa Rose, CA 95403.

As the number of antenna elements increase, the processing power to perform accurate modeling quickly overpowers any processing capability, so that direct modeling becomes impossible and approximations must be used for modeling and/or testing of prototypes are used to determine performance of designs.

BRIEF DESCRIPTION OF THE DRAWINGS

FIG. 6 shows a simplified pattern of a phased array antenna that illustrates the process shown in FIG. 5.

FIG. 7, FIG. 8 and FIG. 9 show highlighted sections illustrating selected ports of a phased array antenna to illustrate the process shown in FIG. 5

DETAILED DESCRIPTION

Figure 1:
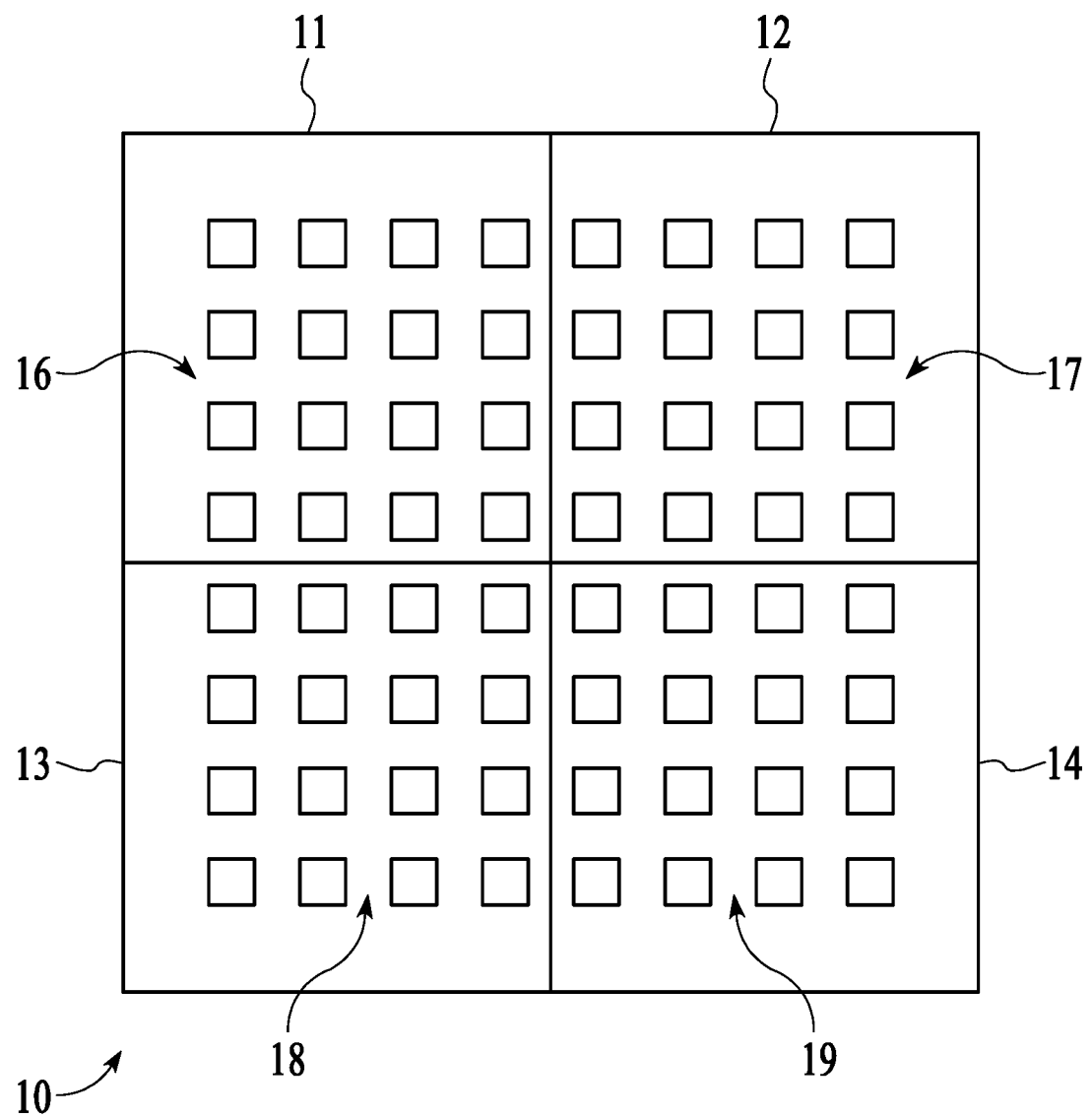
FIG. 1 is a simplified block diagram of a phased array antenna.

FIG. 1 is a simplified block diagram of a phased array antenna 10. Phased array antenna 10 is composed of an 8×8 array of antenna elements. In FIG. 1 the antenna elements are separated into four antenna tiles, each with a 4×4 array of antenna elements. For example, an antenna tile 11 has a 4×4 array of antenna elements 16. An antenna tile 12 has a 4×4 array of antenna elements 17. An antenna tile 13 has a 4×4 array of antenna elements 18. An antenna tile 14 has a 4×4 array of antenna elements 19.

While phased array antenna 10 has four antenna tiles of 16 antenna elements, phased array antennas can include hundreds or thousands or more antenna elements divided into any number of antenna tiles. Further, while FIG. 1 shows square antenna elements arranged on square tiles, antenna elements and antenna tiles can have any shape and any size depending on the antenna characteristics desired for a particular application. The small number, simple shapes and simple arrangements of antenna elements are shown in FIG. 1 to aid in describing operations that increase exponentially in complexity with the increasing number of antenna elements. This simplification of size and arrangement of phased array antenna 10 in FIG. 1 allows a full explanation of the principles of operation that can be applied by a person of ordinary skill of the art to phased array antennas of any size and shape.

Figure 2:
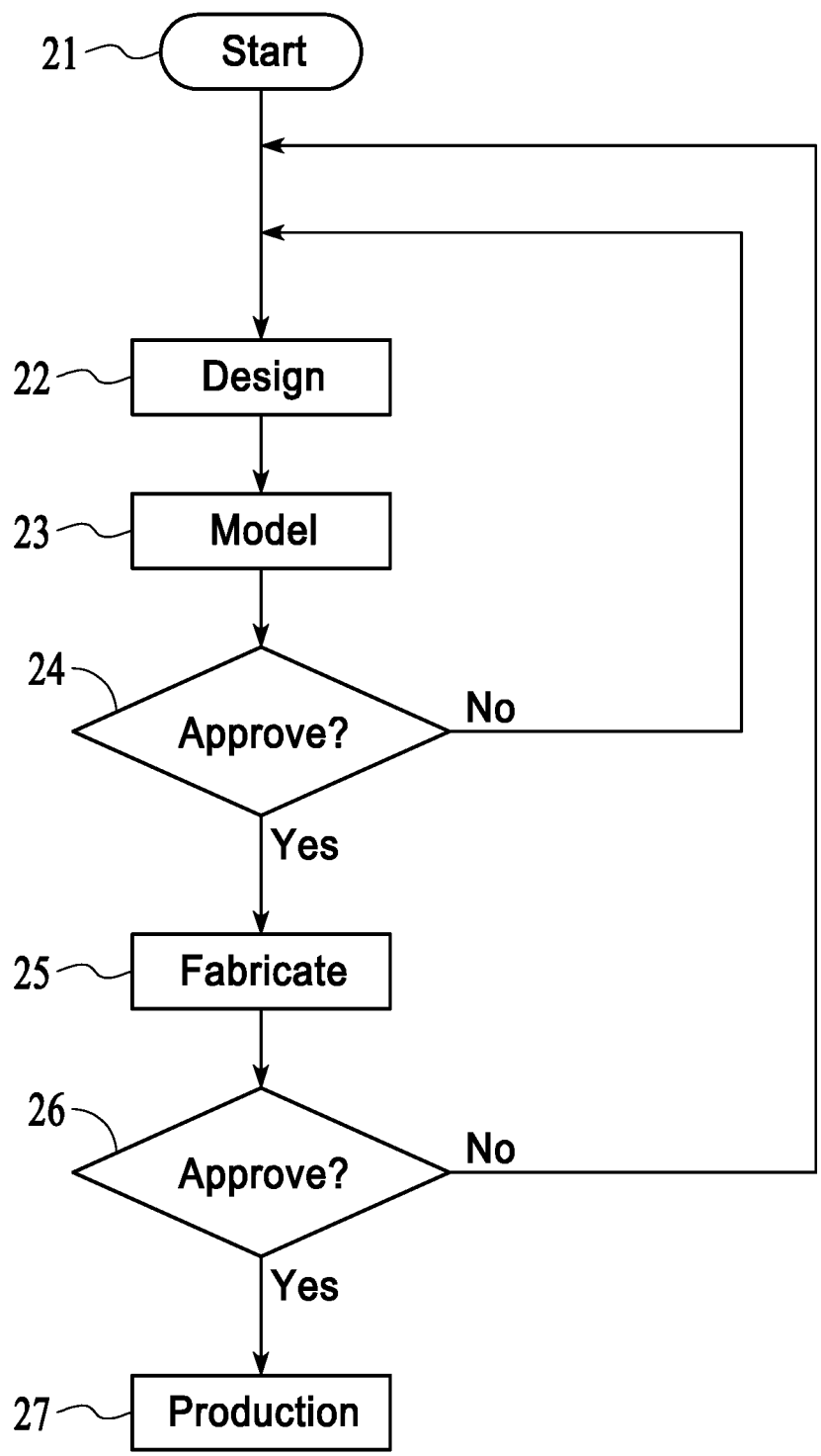
FIG. 2 is a flowchart illustrating a simplified manufacturing process, from design to production, of a phased array antenna.

FIG. 2 is a flowchart illustrating a simplified manufacturing process, from design to production, of phased array antenna 10. In a block 21 the process starts. In a block 22, phase array antenna 10 is designed. In a block 23, the design for phase array 10 is modeled and tested. A software tool such as Pathwave EM Design (EMPro) software is typically used in the modeling. Design and testing is typically an interactive process where after modeling, design changes are made and modeling is performed on the revised design. Eventually the projected performance of the design is sufficiently satisfactory to move onto prototyping for further testing. Block 24 represents the decision point where after modeling a design is approved for prototyping or where further design revisions are sought.

Fabrication block 25 represents the point where a prototype is built and tested. This can be an iterative process in that if the prototype does not perform satisfactorily further design revisions are required. Block 26 represents the decision point where after fabrication, a prototype is approved for manufacturing or where further design revisions are sought. Since fabrication is significantly more expensive than modeling, costs are effectively reduced where modeling can most accurately predict performance of prototypes thereby avoiding redesigning after the initial fabrication block 25, or at least minimizing the times the product must be prototyped.

When a prototype performs satisfactorily, in a block 27, the design is released for manufacture, and the product is manufactured and placed into service.

Figure 3:
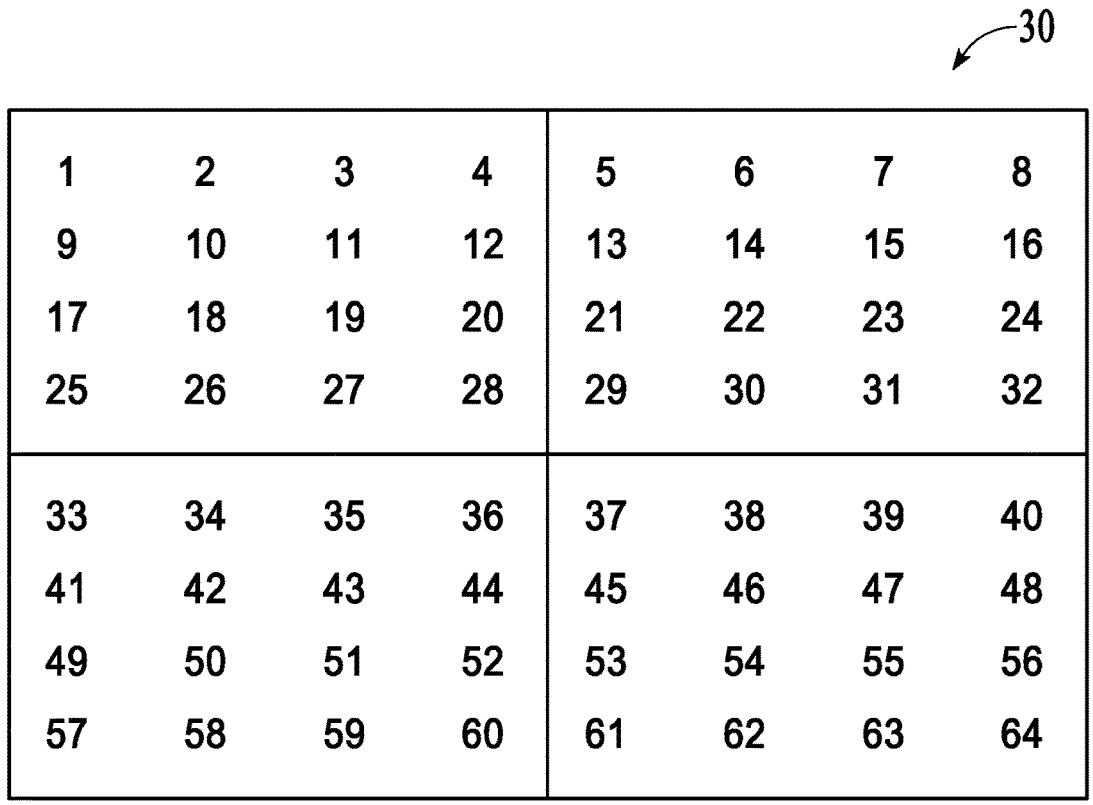
FIG. 3 shows a simplified pattern of a phased array antenna to be manufactured.

FIG. 3 shows an 8×8 array pattern 30 used in the modeling of phased array antenna 10. The antenna elements in array pattern 30 are numbered from 1 to 64.

Figure 4:
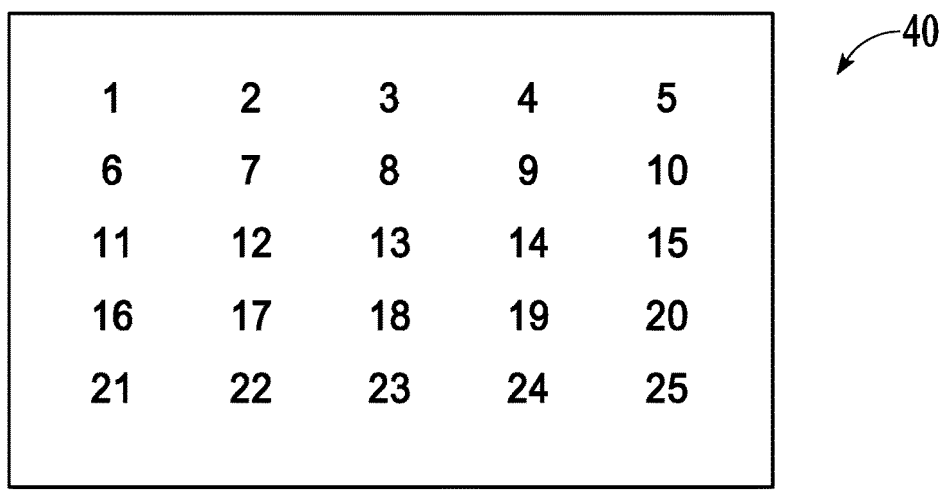
FIG. 4 shows a pattern for a reduced-sized phased array antenna used to model performance of the phased array antenna shown in FIG. 3.

FIG. 4 shows a 5×5 array 40 also used in the modeling of phased array antenna 10. The antenna elements in array pattern 40 are numbered from 1 to 25.

Figure 5:
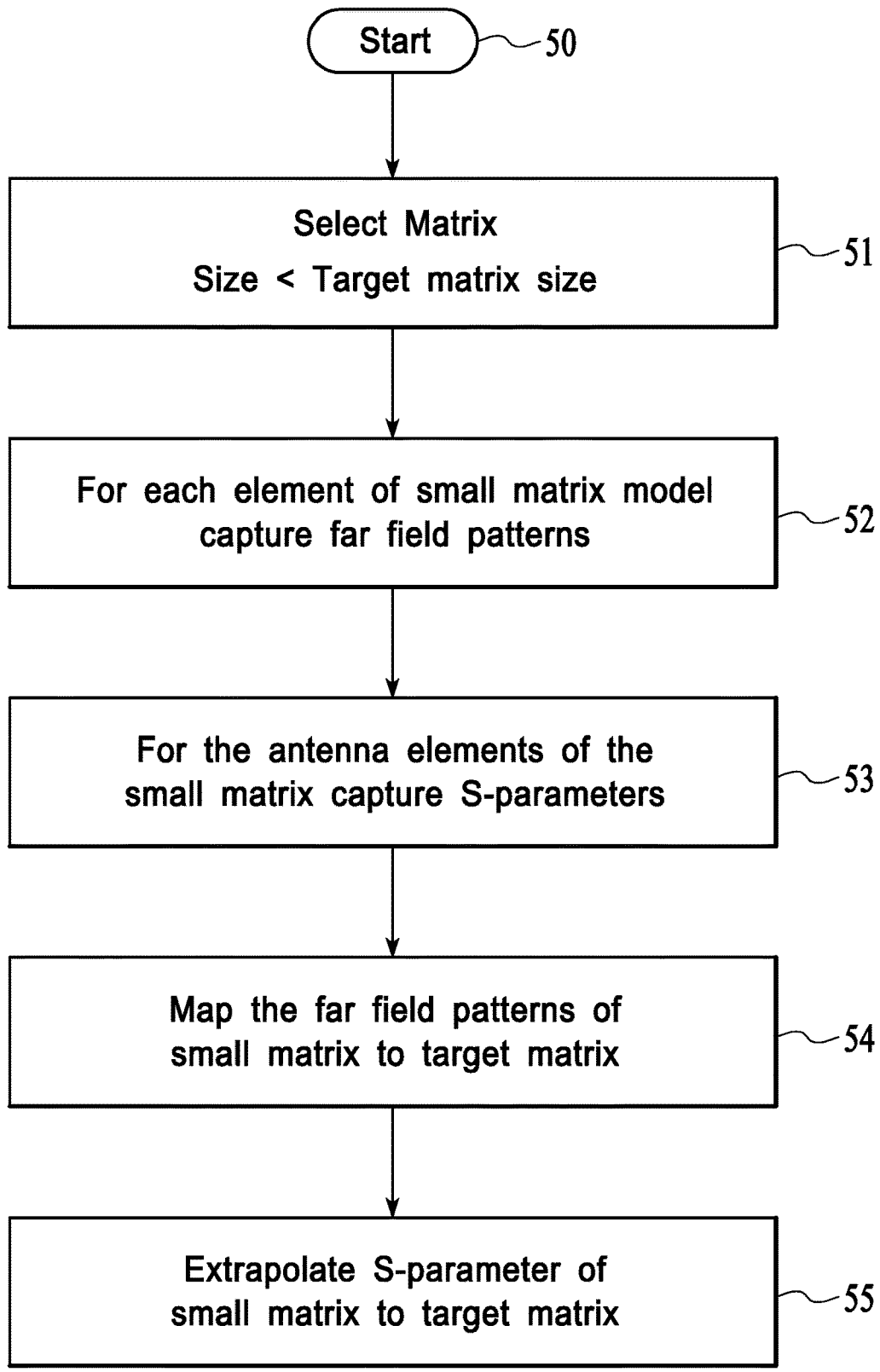
FIG. 5 is a flowchart illustrating a process utilized to model the phased array antenna shown in FIG. 3 based on an extrapolation of the modeling the phased array antenna shown in FIG. 4.

FIG. 5 is a flowchart illustrating a process utilized to model the phased array antenna 10 using the array pattern shown in FIG. 3 based on an extrapolation of the modeling of phased array antenna 40 shown in FIG. 4.

In a block 50, the process starts. In a block 51, for a phased array antenna of M rows and N columns arranged as an M×N array, where M and N are any integer number, a smaller phased array antenna of size m rows by n columns (where m and n are odd integers) arranged as an m×n array is constructed and simulated in an electromagnetic (EM) simulator. Each antenna element can be of any size or shape. A commercially available EM simulator such as Pathwave EM Design (EMPro) software can be used to simulate the performance of the phased array simulator.

For the example illustrated by FIG. 3 and FIG. 4, the phased array antenna is 8×8 and the smaller phased array antenna is 5×5. This is a simplified example, as the phased array antenna to be modeled can typically be 64×64 or larger which may require too many calculations and too much data to be directly modeled by a commercially available EM simulator.

In a block 52, the far field embedded patterns of all the m*n antenna elements are captured into individual files at all the desired frequencies. An embedded pattern of an element is one where only that element is excited while all other elements are terminated in a 50 ohm impedance. The locations of the antenna elements are also captured as X, Y, Z coordinates.

For the example illustrated by FIG. 3 and FIG. 4, this means that the far field patterns at all desired frequencies are captured for each of the twenty-five antenna elements of array 40. The locations of the antenna elements in twenty-five element array 40 are also captured as X, Y, Z coordinates.

Input to the EM simulator will typically include geometry of the antenna elements, arrangement of the antenna elements, spacing between the antenna elements, and properties of the materials from which the antenna elements are composed. The outputs from the EM simulator defining the far field patterns include, for example, energy distribution, noise, gain efficiency throughout three dimensional space and so on.

In a block 53, the S-parameters are captured from the EM simulator for the m×n array. Each antenna element of the m×n array is treated as a port for the purpose of calculating the S-parameters. The matrix of S-parameters will have (m*n)*(m*n) S-parameter values. For 5×5 array 40, for example, the matrix of S-parameters will have (5*5)*(5*5) =625 S-parameter values.

In a block 54, the far field patterns captured for the antenna elements of the small array are mapped to the antenna elements of the target array, as described below. Before the start of the mapping any additional phase included into the captured embedded pattern of each element is removed. After completion of the mapping the phase dependent on the location of the element pattern in the target array is added back while computing the overall target array far field pattern.

The far field patterns captured for the antenna elements at the four corners of the small array are mapped to the corner antenna elements of the target array.

The four outside edges of the small array are mapped to the four outside edges of the target array. For the mapping, starting from the corners, each of the far field pattern files for antenna elements along each edge of the small array is mapped only once into antenna elements along a corresponding edge of the target array, except for the far field pattern file for the middle antenna element of each edge of the small array, which is repeatedly mapped to all the remaining middle antenna elements of the corresponding edge of the target array.

Once far field patterns from antenna elements of the four outside edges of the small array are mapped to antenna elements of the four outside edges of the target array, antenna elements at the ends of each row of the target array will already have far field patterns from the small array mapped into them. For the remaining antenna elements in each row of the target array, the row of the small array that has the same far field pattern files at the ends of the row is used to map far field patterns files into the remaining antenna elements of the corresponding row of the target array.

For the mapping, starting from the ends of the row, each of the far field pattern files for the row for the small array is mapped only once into the corresponding row of the target array, except for the far field pattern file for the middle antenna element of the row, which is repeatedly mapped to all the remaining middle antenna elements of the corresponding row of the target array.

Instead of rows, columns can be used. Each column of the target array will have far field pattern files mapped from the small antenna for each of the ends of the column. For each column of the target array, the column of the small array that has the same far field pattern files at the ends of the column is used to map far field patterns files to that corresponding column of the target array. For the mapping, starting from the ends of the column, each of the far field pattern files for the column for the small array is mapped only once into the target array, except for the far field pattern file for the middle antenna element of the column of the small array, which is repeatedly mapped to all the remaining middle antenna elements of the column of the target array.

FIG. 6 represents the results of performing this mapping of the far field patterns captured for the antenna elements of small array 40 into the antenna elements of target array 60.

The far field patterns captured for the antenna elements at the four corners of small array 40 are mapped to the four corner antenna elements of target array 60. As shown in FIGS. 6, array corners 1, 5, 21 and 25 of small array 40 have been mapped into the corners of target array 60.

The four outside edges of small array 40 are mapped to the four outside edges of target array 60. For the mapping, starting from the corners, each of the far field pattern files for small array 40 is mapped only once into target array 60, except for the far field pattern file for the middle antenna element of the edge, which is repeatedly mapped to all the remaining middle antenna elements of target array 60. As shown in FIG. 6, the top edge (1, 2, 3, 4, 5) of small array 40 has been mapped as (1, 2, 3, 3, 3, 3, 4, 5) into the antenna elements at the top of edge of target array 60. The left edge (1, 6, 11, 16, 21) of small array 40 has been mapped as (1, 6, 11, 11, 11, 11, 16, 21) into the antenna elements on the left of edge of target array 60. And so on.

Now each row of target array 60 will have far field pattern files mapped from the small antenna array 40 for each of the ends of the row. For each row of target array 60, the row of small array 40 that has the same far field pattern files at the ends of the row is used to map far field patterns files to that row of target array 60. For the mapping, starting from the ends of the row, each of the far field pattern files for the row for small array 40 is mapped only once into target array 60, except for the far field pattern file for the middle antenna element of the row, which is repeatedly mapped to all the remaining middle antenna elements of the row of target array 60. For example, as shown in in FIG. 6, the row (6, 7, 8, 9, 10) of small array 40 has been mapped as (6, 7, 8, 8, 8, 8, 9, 10) in target array 60. Likewise, the row (16, 17, 18, 19, 20) of small array 40 has been mapped as (16, 17, 18, 18, 18, 18, 19, 20) in target array 60. The row (11, 12, 13, 14, 15) of small array 40 has been mapped into several rows in target array 60 as (11, 12, 13, 13, 13, 13, 14, 15).

Likewise, for each column of target array 60, the column of small array 40 that has the same far field pattern files at the ends of the column is mapped to a column of target array

60. For the mapping, starting from the ends of the column, each of the far field pattern files for the column for small array 40 is mapped only once into target array 60, except for the far field pattern file for the middle antenna element of the column, which is repeatedly mapped to all the remaining middle antenna elements of the column of target array 60. For example, as shown in in FIG. 6, the column (2, 7, 12, 17, 22) of small array 40 has been mapped as (2, 7, 12, 12, 12, 12, 17, 22) in target array 60. Likewise, the column (4, 9, 14, 19, 24) of small array 40 has been mapped as (4, 9, 14, 14, 14, 14, 19, 24) in target array 60. The column (3, 8, 13, 18, 23) of small array 40 has been mapped into several columns in target array 60 as (3, 8, 13, 13, 13, 13, 18, 23).

In a block 55, S-parameters of the small array are mapped to the target array. For the calculation of S-parameters each antenna element is regarded as a port. In the mapping, the matrix of S-parameters saved in block 53 is mapped onto the larger array. For each port of the target array, the small array is first laid over the target array so that the port of the target array is aligned with a corresponding port of the small array. Then two-port S-parameters for the corresponding port (as a first port for the two-port S-parameter) of the small array and each of the ports (as a second port for the two-port S-parameter) of the small array are copied as S-parameters for the target array where the small array overlays the target array. Where the small array does not overlay the target array a zero or another minimal value issued for two-port S-parameter values for the corresponding port (as a first port for the two-port S-parameter) and each of the ports (as a second port for the two-port S-parameter) of the target array where the small array does not overlay the target array.

The alignment of each port of the target array with a corresponding port of the small array is performed to make sure each port of the target array uses values from the port of the small array that has the most similar surrounding ports. To arrive at the correct alignment, for each selected port of the target array, the small array is aligned so that the middle port of the small array is aligned over the selected port and then if any of the ports of the small array is located outside the boundaries of the target array, a location of the small array is shifted until the small array is completely within the large array.

As a result of using the above methodology, the corner ports of the small array are aligned directly to corresponding corner ports of the target array.

Also, ports along outside edges of the small array are aligned to ports along corresponding outside edges of the target array so that along each edge starting from corners of the edge, each port of the edge of the small array is aligned only once into a corresponding port of the corresponding edge of the target array, except for a middle port of the edge of the small array which is aligned into all remaining ports of the corresponding edge of the target array.

Likewise, along each row of the target array, each port of the row of the small array is aligned only once into a corresponding port of the corresponding row of the target array, except for a middle port of the row of the small array which is aligned into all remaining ports of the corresponding row of the target array, wherein each row of the target array corresponds to a row of the small array when end row ports from the small array have already been mapped into row end ports of the corresponding target array.

Also, along each column of the target array, each port of the column of the small array is aligned only once into a corresponding port of the corresponding column of the target array, except for a middle port of the column of the small array which is aligned into all remaining ports of the corresponding column of the target array, wherein each column of the target array corresponds to a column of the small array when end column ports from the small array have already been mapped into column end ports of the corresponding target array.

For the example using 8×8 array 30 shown in FIG. 3 as the target array and 5×5 array 40 shown in FIG. 4 as the small array, FIG. 6 gives the port of 5×5 array 40 that is to be arrayed with each port of 8×8 array 30.

For example, port 1 of 8×8 array 30 is aligned with port 1 of 5×5 array 40, as shown by the array in FIG. 6. Likewise, port 2 of 8×8 array 30 is aligned with port 2 of 5×5 array 40, as shown by the array in FIG. 6. Likewise, port 3 of 8×8 array 30 is aligned with port 3 of 5×5 array 40, as shown by the array in FIG. 6. Likewise, port 4 of 8×8 array 30 is aligned with port 3 of 5×5 array 40, as shown by the array in FIG. 6. Likewise, port 5 of 8×8 array 30 is aligned with port 3 of 5×5 array 40, as shown by the array in FIG. 6. Likewise, port 9 of 8×8 array 30 is aligned with port 6 of 5×5 array 40, as shown by the array in FIG. 6. Likewise, port 10 of 8×8 array 30 is aligned with port 7 of 5×5 array 40, as shown by the array in FIG. 6. Likewise, port 27 of 8×8 array 30 is aligned with port 13 of 5×5 array 40, as shown by the array in FIG. 6. And so on.

Figure 7:
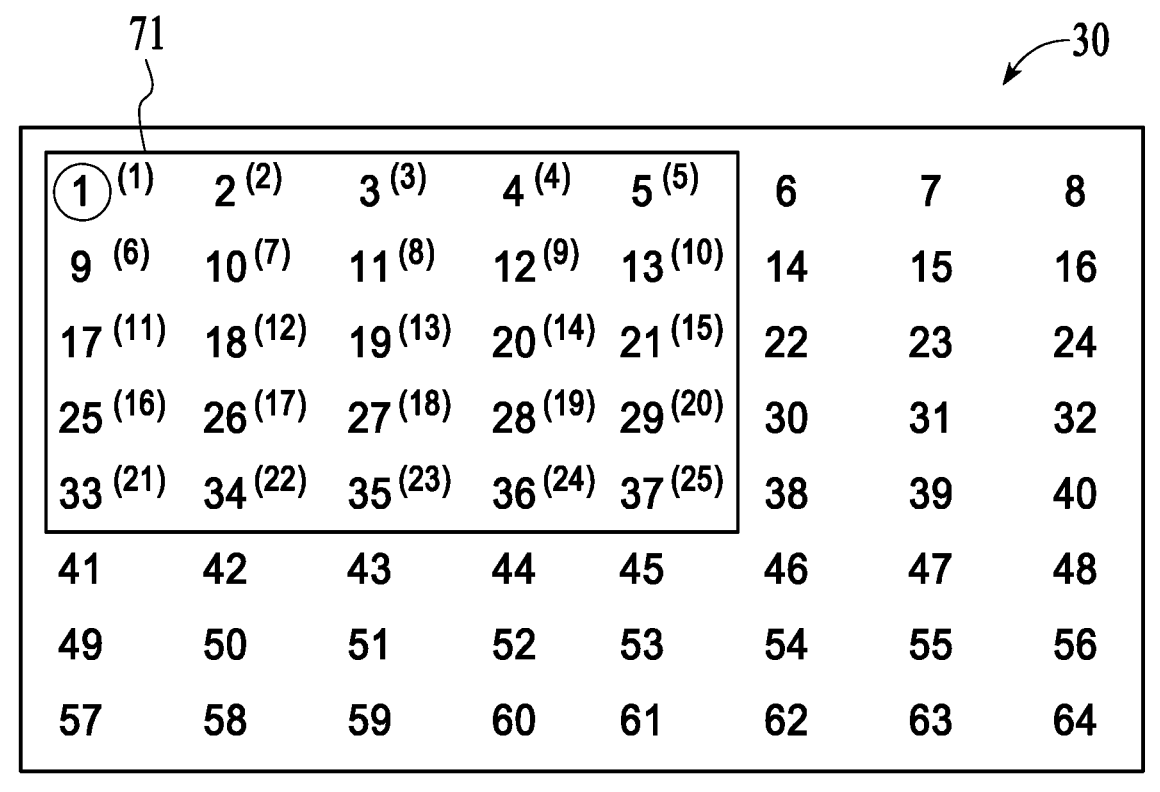

In FIG. 7, box 71 highlights where 5×5 array 40 overlays 8×8 array 30 for port 1 of 8×8 array 30. In FIG. 7 the locations of element/ports of 5×5 array 40 are numbered using parenthesis as (1), (2), . . . , (25) while the locations of element/ports of 8×8 array 30 are numbered without parenthesis as 1, 2, . . . , 64.

For port 1 of 5×5 array 40 there are twenty-five S-parameters: (1,1), (1,2), (1,3) . . . (1,25). For port 1 of 8×8 array 30 there are sixty-four S-parameters: (1,1), (1,2), (1,3) . . . (1,64). Where ports of 5×5 array 40 overlap the ports of 8×8 array 30, the corresponding S-parameters of 5×5 array 40 are used for the ports of 8×8 array 30. Thus, S-parameters for ports (1,1) . . . (1,5) of 5×5 array 40 are used respectively as S-parameters for ports (1,1) . . . (1,5) of 8×8 array 30. The S-parameters for ports (1,6) . . . (1,10) of 5×5 array 40 are used respectively as S-parameters for ports (1,9) . . . (1,13) of 8×8 array 30. The S-parameters for ports (1,11) . . . (1,15) of 5×5 array 40 are used respectively as S-parameters for ports (1,17) . . . (1,21) of 8×8 array 30. The S-parameters for ports (1,16) . . . (1,20) of 5×5 array 40 are used respectively as S-parameters for ports (1,25) . . . (1,29) of 8×8 array 30. The S-parameters for ports (1,21) . . . (1,25) of 5×5 array 40 are used respectively as S-parameters for ports (1,33) . . . (1,37) of 8×8 array 30. All the other parameters for port 1 of 8×8 array 30 are assigned the value of zero or some other minimal value.

In FIG. 8, box 81 highlights where 5×5 array 40 overlays 8×8 array 30 for port 25 of 8×8 array 30. Port 11 of 5×5 array 40 is aligned with port 25 of 8×8 array 30. Where ports of 5×5 array 40 overlap the ports of 8×8 array 30, the corresponding S-parameter 5×5 array 40 are copied to the ports of 8×8 array 30. Thus, S-parameters for ports (11,1) . . . (11,5) of 5×5 array 40 are used respectively as S-parameters for ports (25,9) . . . (25,13) of 8×8 array 30. The S-parameters for ports (11,6) . . . (11,10) of 5×5 array 40 are used respectively as S-parameters for ports (25,17) . . . (25,21) of 8×8 array 30. The S-parameters for ports (11,11) . . . (11,15) of 5×5 array 40 are used respectively as S-parameters for ports (25,25) . . . (25,29) of 8×8 array 30. The S-parameters for ports (11,16) . . . (11,20) of 5×5 array 40 are used respectively as S-parameters for ports (25,33) . . . (25,37) of 8×8 array 30. The S-parameters for ports (11,21) . . . (11,25) of 5×5 array 40 are used respectively as S-parameters for ports (25,41) . . . (25,45) of 8×8 array 30. All the other parameters for port 25 of 8×8 array 30 are assigned the value of zero or some other minimal value.

In FIG. 9, box 91 highlights where 5×5 array 40 overlays 8×8 array 30 for port 28 of 8×8 array 30. Port 13 of 5×5 array 40 is aligned with port 28 of 8×8 array 30. Where ports of 5×5 array 40 overlap the ports of 8×8 array 30, the corresponding S-parameter 5×5 array 40 are copied to the ports of 8×8 array 30. Thus, S-parameters for ports (13,1) . . . (13,5) of 5×5 array 40 are used respectively as S-parameters for ports (28,10) . . . (28,14) of 8×8 array 30. The S-parameters for ports (13,6) . . . (13,10) of 5×5 array 40 are used respectively as S-parameters for ports (28,18) . . . (28,22) of 8×8 array 30. The S-parameters for ports (13,11) . . . (13,15) of 5×5 array 40 are used respectively as S-parameters for ports (28,26) . . . (28,30) of 8×8 array 30. The S-parameters for ports (13,16) . . . (13,20) of 5×5 array 40 are used respectively as S-parameters for ports (28,34) . . . (28,38) of 8×8 array 30. The S-parameters for ports (13,21) . . . (13,25) of 5×5 array 40 are used respectively as S-parameters for ports (28,42) . . . (28,46) of 8×8 array 30. All the other parameters for port 25 of 8×8 array 30 are assigned the value of zero or some other minimal value.

While the foregoing written description of the invention enables one of ordinary skill to make and use what is considered presently to be the best mode thereof, those of ordinary skill will understand and appreciate the existence of variations, combinations, and equivalents of the specific embodiment, method, and examples herein. The invention should therefore not be limited by the above described embodiment, method, and examples, but by all embodiments and methods within the scope and spirit of the invention as claimed.

The invention claimed is:

1. A method for manufacturing a phased array antenna, the method comprising:
    designing a proposed phased array antenna having a target array of antenna elements;
    modeling the proposed phased array antenna, including:
        selecting a small array of antenna elements wherein the small array of antenna elements has fewer antenna elements than the target array of antenna elements,
        for each antenna element of the small array of antenna elements, capturing far field patterns for a plurality of signal frequencies,
        capturing S-parameters for the small array of antenna elements for the plurality of signal frequencies, wherein each antenna element in the small array of antenna elements is regarded as a port of the small array of antenna elements when capturing the S-parameters for the small array of antenna elements,
        mapping the far field patterns captured for the antenna elements of the small array of antenna elements to the antenna elements of the target array of antenna elements, wherein mapping the far field patterns includes:
            mapping far field patterns of corner antenna elements of the small array of antenna elements to corresponding corner antenna elements of the target array of antenna elements; and
            mapping far field patterns of each antenna element along each outside edge of the small array of antenna elements to an antenna element along a corresponding outside edge of the target array of antenna elements, except for one antenna element of each outside edge of the small array of antenna elements, which is mapped into all remaining antenna elements of the corresponding outside edge of the target array of antenna elements; and
        mapping the S-parameters captured for the small array of antenna elements to the target array of antenna elements, wherein each antenna element in the target array of antenna elements is regarded as a port of the target array of antenna elements when mapping the S-parameters to the target array of antenna elements;
    predicting performance of the proposed phased array antenna based on the modeling; and
    when the predicted performance is satisfactory, physically building the proposed phased array antenna.

2. The method of claim 1 wherein the mapping of the far field patterns of each antenna element along each outside edge of the small array of antenna elements comprises, starting from corners of each outside edge of the target array of antenna elements, mapping the far field patterns for each antenna element of the outside edge of the small array of antenna elements only once into the antenna element along the corresponding outside edge of the target array of antenna elements, and wherein a middle antenna element of the outside edge of the small array of antenna elements is mapped into all remaining antenna elements of the corresponding outside edge of the target array of antenna elements.

3. The method of claim 2 wherein the mapping of the far field patterns captured for the antenna elements of the small array of antenna elements to the antenna elements of the target array of antenna elements further includes:
    mapping far field patterns of antenna elements in rows of the small array of antenna elements to antenna elements in rows of the target array of antenna elements, including:
        along each row of the target array of antenna elements, mapping far field patterns for each antenna element of a row of the small array of antenna elements only once into a corresponding antenna element of a corresponding row of the target array of antenna elements, except for a middle antenna element of the row of the small array of antenna elements which is mapped into all remaining antenna elements of the corresponding row of the target array of antenna elements, wherein each row of the target array of antenna elements corresponds to the row of the small array of antenna elements when end row antenna elements from the small array of antenna elements have already been mapped into end row antenna elements of the target array of antenna elements.

4. The method of claim 2 wherein the mapping of the far field patterns captured for the antenna elements of the small array of antenna elements to the antenna elements of the target array of antenna elements further includes:
    mapping far field patterns of antenna elements in columns of the small array of antenna elements to antenna elements in columns of the target array of antenna elements, including:
        along each column of the target array of antenna elements, mapping far field patterns for each antenna element of a column of the small array of antenna elements only once into a corresponding antenna element of a corresponding column of the target array of antenna elements, except for a middle antenna element of the column of the small array of antenna elements which is mapped into all remaining antenna elements of the corresponding column of the target array of antenna elements, wherein each column of the target array of antenna elements corresponds to the column of the small array of antenna elements when end column antenna elements from the small array of antenna elements have already been mapped into column end antenna elements of the target array of antenna elements.

5. The method of claim 1 wherein the mapping of the S-parameters captured for the small array of antenna elements to the target array of antenna elements includes:
for each port of the target array of antenna elements, laying the small array of antenna elements over the target array of antenna elements so that the port of the target array of antenna elements is aligned with a corresponding port of the small array of antenna elements, and performing as follows:
copying two-port S-parameters for the corresponding port of the small array of antenna elements with respect to each of the other ports of the small array of antenna elements as S-parameters for the target array of antenna elements where the small array of antenna elements overlays the target array of antenna elements, wherein the two-port S-parameters are determined using the corresponding port of the small array of antenna elements as a first port and each of the other ports of the small array of antenna elements as a second port, and
using a zero for two-port S-parameter values for the corresponding port and each of the other ports of the target array of antenna elements where the small array of antenna elements does not overlay the target array of antenna elements.

6. The method of claim 5 wherein the port of the target array of antenna elements is aligned with the corresponding port of the small array of antenna elements as follows:
aligning corner ports of the small array of antenna elements directly to corresponding corner ports of the target array of antenna elements; and
aligning ports along outside edges of the small array of antenna elements to ports along corresponding outside edges of the target array of antenna elements, including:
starting from corners of each outside edge, aligning each port of the outside edge of the small array of antenna elements only once into a corresponding port of the corresponding outside edge of the target array of antenna elements, except for a middle port of the outside edge of the small array of antenna elements which is aligned into all remaining ports of the corresponding outside edge of the target array of antenna elements.

7. The method of claim 5 wherein the port of the target array of antenna elements is aligned with the corresponding port of the small array of antenna elements as follows:
aligning corner ports of the small array of antenna elements directly to corresponding corner ports of the target array of antenna elements;
aligning ports along outside edges of the small array of antenna elements to ports along corresponding outside edges of the target array of antenna elements, including:
starting from corners of each outside edge, aligning each port of the outside edge of the small array of antenna elements only once into a corresponding port of the corresponding outside edge of the target array of antenna elements, except for a middle port of the outside edge of the small array of antenna elements which is aligned into all remaining ports of the corresponding outside edge of the target array of antenna elements; and
aligning ports in rows of the small array of antenna elements to ports in corresponding rows of the target array of antenna elements, including:
along each row of the target array of antenna elements, aligning each port of the row of the small array of antenna elements only once into a corresponding port of the corresponding row of the target array of antenna elements, except for a middle port of the row of the small array of antenna elements which is aligned into all remaining ports of the corresponding row of the target array of antenna elements, wherein each row of the target array of antenna elements corresponds to a row of the small array of antenna elements when end row ports from the small array of antenna elements have already been mapped into row end ports of the target array of antenna elements.

8. The method of claim 5 wherein the port of the target array of antenna elements is aligned with the corresponding port of the small array of antenna elements as follows:
aligning corner ports of the small array of antenna elements directly to corresponding corner ports of the target array of antenna elements;
aligning ports along outside edges of the small array of antenna elements to ports along corresponding outside edges of the target array of antenna elements, including:
starting from corners of each outside edge, aligning each port of the outside edge of the small array of antenna elements only once into a corresponding port of the corresponding outside edge of the target array of antenna elements, except for a middle port of the outside edge of the small array of antenna elements which is aligned into all remaining ports of the corresponding outside edge of the target array of antenna elements; and
aligning ports in columns of the small array of antenna elements to ports in corresponding columns of the target array of antenna elements, including:
along each column of the target array of antenna elements, aligning each port of a column of the small array of antenna elements only once into a corresponding port of a corresponding column of the target array of antenna elements, except for a middle port of the column of the small array of antenna elements which is mapped into all remaining ports of the corresponding column of the target array of antenna elements, wherein each column of the target array of antenna elements corresponds to a column of the small array of antenna elements when end column ports from the small array of antenna elements have already been mapped into column end ports of the target array of antenna elements.

9. The method of claim 5 wherein each port of the target array of antenna elements is aligned with the corresponding port of the small array of antenna elements so that a middle of the small array of antenna elements is aligned over the port of the target array of antenna elements, and when any of the ports of the small array of antenna elements are located outside edges of the target array of antenna elements, a location of the small array of antenna elements is shifted until the small array of antenna elements is completely within the target array of antenna elements.

10. The method of claim 1 wherein the small array of antenna elements has an odd number of rows and an odd number of columns.

11. A method for modeling a phased array antenna having a target array of antenna elements, the method comprising:
selecting a small array of antenna elements wherein the small array of antenna elements has fewer antenna elements than the target array of antenna elements;
for each antenna element of the small array of antenna elements, capturing far field patterns for a plurality of signal frequencies;
capturing S-parameters for the small array of antenna elements for the plurality of signal frequencies, where each antenna element in the small array of antenna elements is regarded as a port of the small array of antenna elements when capturing the S-parameters for the small array of antenna elements;
mapping the far field patterns captured for the antenna elements of the small array of antenna elements to antenna elements of the target array of antenna elements, wherein mapping the far field patterns includes:
mapping far field patterns of corner antenna elements of the small array of antenna elements to corresponding corner antenna elements of the target array of antenna elements; and
mapping far field patterns of each antenna element along each outside edge of the small array of antenna elements to an antenna element along a corresponding outside edge of the target array of antenna elements, except for one antenna element of each outside edge of the small array of antenna elements, which is mapped into all remaining antenna elements of the corresponding outside edge of the target array of antenna elements; and
mapping the S-parameters captured for the small array of antenna elements to the target array of antenna elements, where each antenna element in the target array of antenna elements is regarded as a port of the target array of antenna elements when mapping the S-parameters to the target array of antenna elements.

12. The method of claim 11 wherein the mapping of the far field patterns of each antenna element along each outside edge of the small array of antenna elements comprises, starting from corners of each outside edge of the target array of antenna elements, mapping the far field patterns for each antenna element of the outside edge of the small array of antenna elements only once into the antenna element along the corresponding outside edge of the target array of antenna elements, wherein a middle antenna element of the outside edge of the small array of antenna elements is mapped into all remaining antenna elements of the corresponding outside edge of the target array of antenna elements.

13. The method of claim 12 wherein the mapping of the far field patterns captured for the antenna elements of the small array of antenna elements to the antenna elements of the target array of antenna elements further includes:
mapping far field patterns of antenna elements in rows of the small array of antenna elements to antenna elements in rows of the target array of antenna elements, including:
along each row of the target array of antenna elements, mapping far field patterns for each antenna element of a row of the small array of antenna elements only once into a corresponding antenna element of a corresponding row of the target array of antenna elements, except for a middle antenna element of the row of the small array of antenna elements which is mapped into all remaining antenna elements of the corresponding row of the target array of antenna elements, wherein each row of the target array of antenna elements corresponds to the row of the small array of antenna elements when end row antenna elements from the small array of antenna elements have already been mapped into row end antenna elements of the target array of antenna elements.

14. The method of claim 12 wherein the mapping of the far field patterns captured for the antenna elements of the small array of antenna elements to the antenna elements of the target array of antenna elements further includes:
mapping far field patterns of antenna elements in columns of the small array of antenna elements to antenna elements in columns of the target array of antenna elements, including:
along each column of the target array of antenna elements, mapping far field patterns for each antenna element of a column of the small array of antenna elements only once into a corresponding antenna element of a corresponding column of the target array of antenna elements, except for a middle antenna element of the column of the small array of antenna elements which is mapped into all remaining antenna elements of the corresponding column of the target array of antenna elements, wherein each column of the target array of antenna elements corresponds to the column of the small array of antenna elements when end column antenna elements from the small array of antenna elements have already been mapped into column end antenna elements of the target array of antenna elements.

15. The method of claim 11 wherein the mapping of the S-parameters captured for the small array of antenna elements to the target array of antenna elements includes:
for each port of the target array of antenna elements, laying the small array of antenna elements over the target array of antenna elements so that the port of the target array of antenna elements is aligned with a corresponding port of the small array of antenna elements and performing:
copying two-port S-parameters for the corresponding port of the small array of antenna elements with respect to each of the other ports of the small array of antenna elements as S-parameters for the target array of antenna elements where the small array of antenna elements overlays the target array of antenna elements, wherein the two-port S-parameters are determined using the corresponding port of the small array of antenna elements as a first port and each of the other ports of the small array of antenna elements as a second port, and
using a zero for two-port S-parameter values for the corresponding port and each of the other ports of the target array of antenna elements where the small array of antenna elements does not overlay the target array of antenna elements.

16. The method of claim 15 wherein the port of the target array of antenna elements is aligned with the corresponding port of the small array of antenna elements as follows:
aligning corner ports of the small array of antenna elements directly to corresponding corner ports of the target array of antenna elements; and
aligning ports along outside edges of the small array of antenna elements to ports along corresponding outside edges of the target array of antenna elements, including:

starting from corners of each outside edge, aligning each port of the outside edge of the small array of antenna elements only once into a corresponding port of the corresponding outside edge of the target array of antenna elements, except for a middle port of the outside edge of the small array of antenna elements which is aligned into all remaining ports of the corresponding outside edge of the target array of antenna elements.

17. The method of claim 15 wherein the port of the target array of antenna elements is aligned with the corresponding port of the small array of antenna elements as follows:

aligning corner ports of the small array of antenna elements directly to corresponding corner ports of the target array of antenna elements;

aligning ports along outside edges of the small array of antenna elements to ports along corresponding outside edges of the target array of antenna elements, including:

from corners of each outside edge, aligning each port of the outside edge of the small array of antenna elements only once into a corresponding port of the corresponding outside edge of the target array of antenna elements, except for a middle port of the outside edge of the small array of antenna elements which is aligned into all remaining ports of the corresponding outside edge of the target array of antenna elements; and aligning ports in rows of the small array of antenna elements to ports in corresponding rows of the target array of antenna elements, including:

along each row of the target array of antenna elements, aligning each port of the row of the small array of antenna elements only once into a corresponding port of the corresponding row of the target array of antenna elements, except for a middle port of the row of the small array of antenna elements which is aligned into all remaining ports of the corresponding row of the target array of antenna elements, wherein each row of the target array of antenna elements corresponds to a row of the small array of antenna elements when end row ports from the small array of antenna elements have already been mapped into row end ports of the target array of antenna elements.

18. The method of claim 15 wherein the port of the target array of antenna elements is aligned with the corresponding port of the small array of antenna elements as follows:

aligning corner ports of the small array of antenna elements directly to corresponding corner ports of the target array of antenna elements;

aligning ports along outside edges of the small array of antenna elements to ports along corresponding outside edges of the target array of antenna elements, including:

starting from corners of each outside edge, aligning each port of the outside edge of the small array of antenna elements only once into a corresponding port of the corresponding outside edge of the target array of antenna elements, except for a middle port of the outside edge of the small array of antenna elements which is aligned into all remaining ports of the corresponding outside edge of the target array of antenna elements; and aligning ports in columns of the small array of antenna elements to ports in corresponding columns of the target array of antenna elements, including:

along each column of the target array of antenna elements, aligning each port of a column of the small array of antenna elements only once into a corresponding port of a corresponding column of the target array of antenna elements, except for a middle port of the column of the small array of antenna elements which is mapped into all remaining ports of the corresponding column of the target array of antenna elements, wherein each column of the target array of antenna elements corresponds to a column of the small array of antenna elements when end column ports from the small array of antenna elements have already been mapped into column end ports of the array of antenna elements.

19. The method of claim 15 wherein each port of the target array of antenna elements is aligned with the corresponding port of the small array of antenna elements so that a middle of the small array of antenna elements is aligned over the port of the target array of antenna elements, and when any of the ports of the small array of antenna elements are located outside edges of the target array of antenna elements, a location of the small array of antenna elements is shifted until the small array of antenna elements is completely within the target array of antenna elements.

20. The method of claim 11 wherein the small array of antenna elements has an odd number of rows and an odd number of columns.

* * * * *